US008195451B2

(12) United States Patent
Toguri

(10) Patent No.: US 8,195,451 B2
(45) Date of Patent: Jun. 5, 2012

(54) APPARATUS AND METHOD FOR DETECTING SPEECH AND MUSIC PORTIONS OF AN AUDIO SIGNAL

(75) Inventor: Yasuhiro Toguri, Kanagawa (JP)

(73) Assignee: Sony Corporation, Tokyo (JP)

( * ) Notice: Subject to any disclaimer, the term of this patent is extended or adjusted under 35 U.S.C. 154(b) by 1038 days.

(21) Appl. No.: 10/513,549

(22) PCT Filed: Feb. 10, 2004

(86) PCT No.: PCT/JP2004/001397
§ 371 (c)(1),
(2), (4) Date: Nov. 4, 2004

(87) PCT Pub. No.: WO2004/079718
PCT Pub. Date: Sep. 16, 2004

(65) Prior Publication Data

US 2005/0177362 A1 Aug. 11, 2005

(30) Foreign Application Priority Data

Mar. 6, 2003 (JP) ............................... P2003-060382

(51) Int. Cl.
*G10L 11/06* (2006.01)
*G10L 19/14* (2006.01)
*G10L 19/00* (2006.01)
*H03G 3/20* (2006.01)
*H04R 29/00* (2006.01)

(52) U.S. Cl. ........ 704/211; 704/208; 704/214; 704/215; 704/238; 704/500; 381/110; 381/56

(58) Field of Classification Search .................. 704/233, 704/231, 214, 215, 238, 239, 208, 216, 500; 381/110, 56
See application file for complete search history.

(56) References Cited

U.S. PATENT DOCUMENTS 4,541,110 A 9/1985 Hopf et al.
(Continued)

FOREIGN PATENT DOCUMENTS

EP 0 637 011 2/1995
(Continued)

OTHER PUBLICATIONS

El-Maleh, K.; Klein, M.; Petrucci, G.; Kabal, P., "Speech/music discrimination for multimedia applications," Acoustics, Speech, and Signal Processing, 2000. ICASSP '00. Proceedings. 2000 IEEE International Conference on , vol. 6, No., pp. 2445-2448 vol. 4, 2000.*

(Continued)

*Primary Examiner* — Paras Shah
(74) *Attorney, Agent, or Firm* — SNR Denton US LLP

(57) ABSTRACT

In an information detecting apparatus (1), a speech kind discrimination unit (11) discriminates and classifies an audio signal at an information source into kind (category) such as music or speech, etc. on a predetermined time basis, and a memory unit/recording medium (13) records discrimination information thereof. A discrimination frequency calculating unit (15) calculates, on a predetermined time basis, discrimination frequency every kind at a predetermined time period longer than the time unit. A time period start/end judgment unit (16) is operative so that in the case where discrimination frequency of a certain kind becomes equal to a predetermined threshold value or more for the first time, and the state where the discrimination frequency is the threshold value or more is continued by a predetermined time, start of continuous time period of the kind is detected, and in the case where the discrimination frequency becomes equal to the predetermined threshold value or less for the first time, and the state where the discrimination frequency is the threshold value or less is continued by a predetermined time, end of continuous time period of the kind is detected.

3 Claims, 6 Drawing Sheets

U.S. PATENT DOCUMENTS

| | | | | | |
|---|---|---|---|---|---|
| 4,926,484 | A * | 5/1990 | Nakano | 381/56 |
| 5,298,674 | A | 3/1994 | Yun | |
| 5,375,188 | A * | 12/1994 | Serikawa et al. | 704/215 |
| 5,712,953 | A * | 1/1998 | Langs | 704/214 |
| 5,794,195 | A * | 8/1998 | Hormann et al. | 704/253 |
| 5,878,391 | A * | 3/1999 | Aarts | 704/233 |
| 5,966,690 | A | 10/1999 | Fujita | |
| 6,185,527 | B1 | 2/2001 | Petkovic et al. | |
| 6,349,278 | B1 * | 2/2002 | Krasny et al. | 704/233 |
| 6,490,556 | B1 * | 12/2002 | Graumann et al. | 704/233 |
| 6,570,991 | B1 * | 5/2003 | Scheirer et al. | 381/110 |
| 6,640,208 | B1 * | 10/2003 | Zhang et al. | 704/214 |
| 6,694,293 | B2 * | 2/2004 | Benyassine et al. | 704/233 |
| 6,785,645 | B2 * | 8/2004 | Khalil et al. | 704/216 |
| 6,901,362 | B1 * | 5/2005 | Jiang et al. | 704/214 |
| 7,260,527 | B2 * | 8/2007 | Koshiba | 704/233 |
| 2003/0055639 | A1 * | 3/2003 | Rees | 704/233 |
| 2005/0228649 | A1 * | 10/2005 | Harb et al. | 704/205 |

FOREIGN PATENT DOCUMENTS

| | | | |
|---|---|---|---|
| EP | 1 083 542 | | 3/2001 |
| EP | 1100073 | A2 * | 5/2001 |
| JP | 5-88695 | A | 4/1993 |
| JP | 8-335091 | A | 12/1996 |
| JP | 10-187182 | | 7/1998 |
| JP | 10-187182 | A | 7/1998 |
| JP | 2910417 | | 4/1999 |
| JP | 2910417 | B2 | 4/1999 |
| JP | 2000-259168 | A | 9/2000 |
| WO | 98/27543 | | 6/1998 |

OTHER PUBLICATIONS

Tancerel, L.; Ragot, S.; Ruoppila, V.T.; Lefebvre, R., "Combined speech and audio coding by discrimination," Speech Coding, 2000. Proceedings. 2000 IEEE Workshop on , vol., No., pp. 154-156, 2000.*

Wu Chou et al.; Robust Singing Detection in Speech/Music Discriminator Design; 2001 IEE International Conference on Acoustics, Speech and Signal Processing Proceedings; Salt Lake City, UT; May 7-11, 2001; IEEE International Conference on Acoustics, Speech, and Signal Processing, New York, NY; IEEE, US; vol. 1 of 6, May 7, 2001, pp. 865-868, XP010803742.

European Search Report dated Nov. 5, 2006.

D. Li, et al., "*Classification of general audio data for content-based retrieval*", Pattern Recognition Letters, Apr. 2001, vol. 22, No. 5, pp. 533-544.

Japanese Patent Office, Office Action issued in Japanese patent application No. 2003-060382, on Mar. 3, 2009.

* cited by examiner

| | | |
|---|---|---|
| TIME | KIND CODE | LIKELIHOOD |

| | | | |
|---|---|---|---|
| TIME PERIOD NO. | KIND CODE | START POSITION | END POSITION |

APPARATUS AND METHOD FOR DETECTING SPEECH AND MUSIC PORTIONS OF AN AUDIO SIGNAL

TECHNICAL FIELD

The present invention relates to an information detecting apparatus and a method therefor, and a program which are adapted for extracting feature quantity from audio signal including speech, music and/or acoustics (sound), or information source including such an audio signal to thereby detect continuous time period of the same kind or category such as speech or music, etc.

This Application claims priority of Japanese Patent Application No. 2003-060382, field on Mar. 6, 2003, the entirety of which is incorporated by reference herein.

BACKGROUND ART

In broadcasting system and/or multi-media system, etc., it is important to efficiently perform management and classifying (sorting) of large contents such as image or speech to easily permit retrieval of such contents. In this case, in order to perform such operation, it is indispensable to recognize information that respective portions in contents have.

Here, many multimedia contents and/or broadcasting contents include audio signal along with video signal. Such audio signal is very useful information in classifying (sorting) of contents and/or detection of scene. Particularly, speech portion and music portion of audio signal included in information are detected in a manner such that they are discriminated, thereby making it possible to perform efficient information retrieval and/or information management.

Meanwhile, as a technology for discriminating between speech and music, a large number of technologies have been conventionally studied. There are proposed techniques of performing such discrimination using, as feature quantity, zero cross number, change (fluctuation) of power and/or change (fluctuation) of spectrum, etc.

For example, in the literature 'J. Saunders, "Real-time discrimination of broadcast speech/music", USA, Proc. IEEE Int. Conf. on Acoustics, Speech, Signal Processing, 1996, pp. 993-996, discrimination of speech/music is performed by using zero cross number.

Moreover, in the literature 'E. Scheire & M. Slaney, "Costruction and evaluation of a robust multifeature speech/music discriminator", USA, Proc. IEEE Int. Conf. on Acoustics, Speech, Signal Processing, 1997, pp 1331-1334, 13 feature quantities including 4 Hz modulation energy, low energy frame rate, spectrum roll-off point, spectrum centroid, spectrim change (Flux) and zero cross rate, etc. are used to discriminate between speech/music to compare and evaluate respective performances.

Further, in the literature 'M. J. Care, E. S. Parris & H. Lloyd-Thomas, "A comparison of features for speech, music discrimination", USA, Proc. IEEE Int. Conf. on Acoustics, Speech, Signal Processing, 1999, March, pp. 149-152, cepstrum coefficient, delta cepstrum coefficient, amplitude, delta amplitude, pitch, delta pitch, zero cross number, and delta zero cross number are caused to be feature quantities, and mixed normal distribution model is used for respective feature quantities to thereby discriminate between speech/music.

In addition to the above, detection technique based on the feature that spectrum peak of music is continued in the time direction while it is stabilized so as to have specific frequency is also studied. Here, stability of spectrum peak is represented also as presence or absence of linear component in the time direction in the spectrogram. The spectrogram is diagram in which frequency is taken on the ordinate and time is taken on the abscissa, and spectrum components are arranged in the time direction to represent the spectrum as image information. As an invention using this feature, there are mentioned, e.g., the literature "Minami, Akutsu, Hamada & Sotomura, "Image Indexing Using Sound Information and its Application", Electronic Information Communication Associates Collection D-11, 1998, J81-th-D- volume 11, No. 3, pp. 529-537", and the Japanese Patent Application Laid Open No. H10-187182.

Such a technology of discriminating and classifying (sorting) speech and music, etc. every predetermined time is applied to thereby have ability to detect start/end position of continuous time period of the same kind or category in audio data.

However, in detecting continuous time period of the same kind by directly using the above-described technology of discriminating and classifying (sorting) kind of speech or music, etc., there exist the following problems.

For example, there are many instances where music consists of many musical instruments, singing speech, sound effect or rhythm by beat musical instrument, etc. Accordingly, in the case where audio data is discriminated every short time, not only portions such that can be necessarily discriminated as music, but also portions to be judged as speech when viewed from short time range, or portions which should be classified (sorted) as other kind are frequently included even during continuous musical time period. Also in the case where continuous time period of conversational speech is detected, it may frequently take place that soundless portion and/or noise such as music, etc. are momentarily inserted similarly even during continuous conversational time period. In addition, even if corresponding portion is portion of clear music or speech, that portion may be erroneously discriminated as erroneous kind by discrimination error. This similarly applies to the case of kind except for speech and/or music.

Accordingly, in the case of a method of detecting continuous time period by directly using kind discrimination result of speech/music, etc. every short time, there takes place the problem that the portion which should be considered as continuous time period when viewed from the long time range may be interrupted in the middle thereof, or temporary noise portion which cannot be considered as continuous time period for the long time range may be conversely considered as continuous time period.

On the other hand, if analysis time for discrimination is elongated for the purpose of avoiding such problem, there takes place the problem that time resolution of discrimination is lowered so that detection rate is lowered in the case where music/speech, etc. is frequently switched.

DISCLOSURE OF THE INVENTION

The present invention has been proposed in view of such conventional actual circumstances, and an object of the present invention is to provide an information detecting apparatus and a method therefor, and a program for allowing computer to execute such information detection processing, which can correctly detect continuous time period which should be considered as the same kind or category when viewed from the long time range in detecting continuous time period of music or speech, etc. in audio data.

To obtain the above-described object, in the information detecting apparatus and the method therefor according to the present invention, feature quantity of an audio signal included in an information source is analyzed to classify and discriminate kind (category) of the audio signal on a predetermined time basis to record the classified and discriminated discrimination information with respect to discrimination information storage means. Further, the discrimination information is read in from the discrimination information storage means to calculate discrimination frequency every predetermined time period longer than the time unit every kind of the audio signal to detect continuous time period of the same kind by using the discrimination frequency.

In the information detecting apparatus and the method therefor, in the case where, e.g., the discrimination frequency of an arbitrary kind becomes equal to a first threshold value or more, and the state where the discrimination frequency is the first threshold value or more is continued for a first time or more, start of the kind or category is detected, and in the case where the discrimination frequency becomes equal to a second threshold value or less and the state where the discrimination frequency is the second threshold value or less is continued for a second time or more, end of the kind or category is detected.

Here, as the discrimination frequency, there may be used a value obtained by averaging, by the time period, likelihood (probability) of discrimination every the time unit of an arbitrary kind, and/or number of discriminations at the time period of arbitrary kind.

In addition, the program according to the present invention serves to allow computer to execute the above-described information detection processing.

Still further objects of the present invention and practical merits obtained by the present invention will become more apparent from the embodiments which will be given below.

BEST MODE FOR CARRYING OUT THE INVENTION

Practical embodiments to which the present invention has been applied will be described in detail with reference to the attached drawings. In the embodiment, the present invention is applied to an information detecting apparatus adapted for discriminating and classifying, on a predetermined time basis, audio data into several kinds (categories) such as conversation speech and music, etc. to record, with respect to a memory unit or a recording medium, time period information such as start position and/or end position, etc. of continuous time period where data of the same kind are successive.

It is to be noted that while a large number of techniques of classifying and discriminating audio data into several kinds have been conventionally studied, kind to be discriminated and the discrimination technique thereof are not specified in the present invention. While explanation will now be given below as an example on the premise that audio data is discriminated into speech or music to detect speech continuous time period or music continuous time period, not only speech time period or music time period, but also speech time period or soundless time period may be detected. In addition, genre of music may be discriminated and classified to detect respective continuous time periods.

Figure 1:
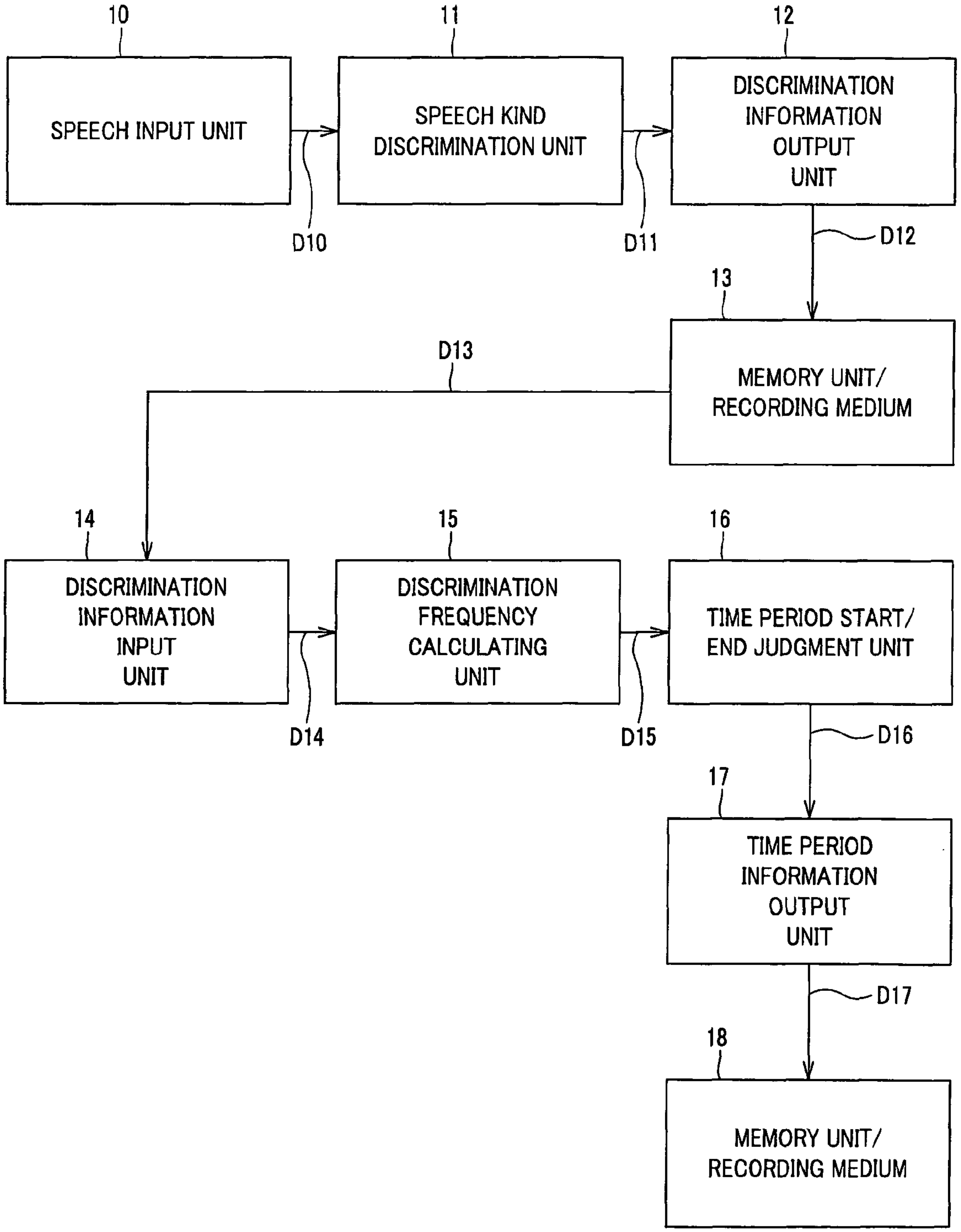
FIG. 1 is a view showing outline of the configuration of an information detecting apparatus in this embodiment.

First, outline of the configuration of the information detecting apparatus in this embodiment is shown in FIG. 1. As shown in FIG. 1, the information detecting apparatus 1 in this embodiment is composed of a speech input unit 10 for reading thereinto audio data of a predetermined format as block data D10 on a predetermined time basis, a speech kind discrimination unit 11 for discriminating kind of the block data D10 on a predetermined time basis to generate discrimination information D11, a discrimination information output unit 12 for converting discrimination information D11 into information of a predetermined format to record the converged discrimination information D12 with respect to a memory unit/recording medium 13, a discrimination information input unit 14 for reading thereinto discrimination information D13 which has been recorded with respect to the memory unit/recording medium 13, a discrimination frequency calculating unit 15 for calculating discrimination frequency D15 of respective kinds or categories (speech/music, etc.) by using the discrimination information D14 which has been read in, a time period start/end judgment unit 16 for evaluating the discrimination frequency D15 to detect start position and end position of continuous time period of the same kind, etc. to allow the positions thus detected to be time period information D16, and a time period information output unit 17 for converting the time period information D16 into information of a predetermined format to record the information thus obtained with respect to a memory unit/recording medium 18 as index information D17.

Here, as the memory unit/recording medium 13, 18, there may be used a memory unit such as memory or magnetic disc, etc., a memory medium such as semiconductor memory (memory card, etc.), etc., and/or a recording medium such as CD-ROM, etc.

In the information detecting apparatus 1 having the configuration as described above, the speech input unit 10 reads thereinto audio data as block data D10 every predetermined time unit to deliver the block data D10 to the speech kind discrimination unit 11.

The speech kind discrimination unit 11 analyzes feature quantity of speech to thereby discriminate and classify block data D10 on a predetermined time basis to deliver discrimination information D11 to the discrimination information output unit 12. Here, as an example, it is assumed that block data D10 is discriminated and classified into speech or music. In this case, it is preferable that time unit to be discriminated is 1 sec. to several sec.

Figures 2, 3, 4:
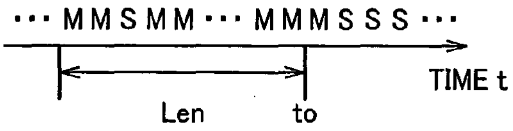
FIG. 2 is a view showing one example of recording format of discrimination information.
FIG. 3 is a view showing one example of time period for calculating discrimination frequency.
FIG. 4 is a view showing one example of recording format of index information.

The discrimination information output unit 12 converts discrimination information D11 which has been delivered from the speech kind discrimination unit 11 into information of a predetermined format to record the converted discrimination information D12 with respect to the memory unit/recording medium 13. Here, an example of recording format of the discrimination information D12 is shown in FIG. 2. In the format example of FIG. 2, 'time' indicating position in audio data, 'kind code' indicating kind at that time position, and 'likelihood (probability)' indicating likelihood (probability) of the discrimination are recorded. "Likelihood" is a value representing certainty of the discrimination result. For example, there may be used likelihood obtained by discrimination technique such as posteriori probability maximization method, and/or inverse number of vector quantization distortion obtained by technique of vector quantization.

The discrimination information input unit 14 reads thereinto discrimination information D13 recorded at the memory unit/recording medium 13 to deliver, to the discrimination frequency calculating unit 15, the discrimination information D14 which has been read in. It is to be noted that, as timing at which read operation is performed, read operation may be performed on the real time basis when the discrimination information output unit 12 records discrimination information D12 with respect to the memory unit/recording medium 13, or read operation may be performed after recording of the discrimination information D12 is completed.

The discrimination frequency calculating unit 15 calculates discrimination frequency every kind at a predetermined time period on a predetermined time basis by using the discrimination information D14 delivered from the discrimination information input unit 14 to deliver discrimination frequency information D15 to the time period start/end judgment unit 16. An example of time period during which discrimination frequency is calculated is shown in FIG. 3. The FIG. 3 shows whether audio data is music (M) or speech (S) is discriminated every several seconds to determine discrimination frequency Ps (t0) of speech and discrimination frequency Pm (t0) of music at time t0 from discrimination information of speech (S) and music (M) at time period represented by Len in the figure (number of discriminations and its likelihood). In this case, it is preferable that length of time period Len is, e.g., about several seconds to ten several seconds.

Here, practical example for calculating discrimination frequency every kind will be explained. The discrimination frequency can be determined by averaging, by predetermined time period, e.g., likelihood at time where discrimination is made into corresponding kind. For example, discrimination frequency Ps(t) of speech at time t is determined as indicated by the following formula (1). Here, in the formula (1), p(t−k) indicates likelihood of discrimination at time (t−k).

$$P_s(t) = \frac{\sum_{k=0}^{Len-1} p(t-k)\cdot S(t-k)}{Len} \quad \text{where, } S(t) = \begin{cases} 1 & \text{kind of } t \text{ is speech} \\ 0 & \text{except for the above} \end{cases} \tag{1}$$

Moreover, assuming that likelihoods are all equal to 1 in the formula (1), it is possible to calculate discrimination frequency Ps (t) simply by using only number of discriminations as indicated by the following formula (2).

$$P_s(t) = \frac{\sum_{k=0}^{Len-1} S(t-k)}{Len} \quad \text{where, } S(t) = \begin{cases} 1 & \text{kind of } t \text{ is speech} \\ 0 & \text{except for the above} \end{cases} \tag{2}$$

Also with respect to music and other kinds, it is possible to calculate discrimination frequency entirely in the same manner.

The time period start/end judgment unit 16 detects start position/end position of continuous time period of the same kind, etc. by using discrimination frequency information D15 delivered from the discrimination frequency calculating unit 15 to deliver the positions thus detected to the time period information output unit 17 as time period information D16.

The time period information output unit 17 converts time period information D16 delivered from the time period start/end judgment unit 16 into information of a predetermined format to record the information thus obtained with respect to the memory unit/recording medium 18 as index information D17. Here, an example of recording format of index information D17 is shown in FIG. 4. In the format example of FIG. 4, there are recorded 'time period number' indicating No. or discriminator (identifier) of continuous time period, 'kind code' indicating kind of the continuous period thereof, and 'start position', 'end position' indicating start time and end time of the continuous time period thereof.

Here, a detection method for start portion/end portion of continuous time period will be explained in more detail with reference to FIGS. 5 and 6.

Figure 5:
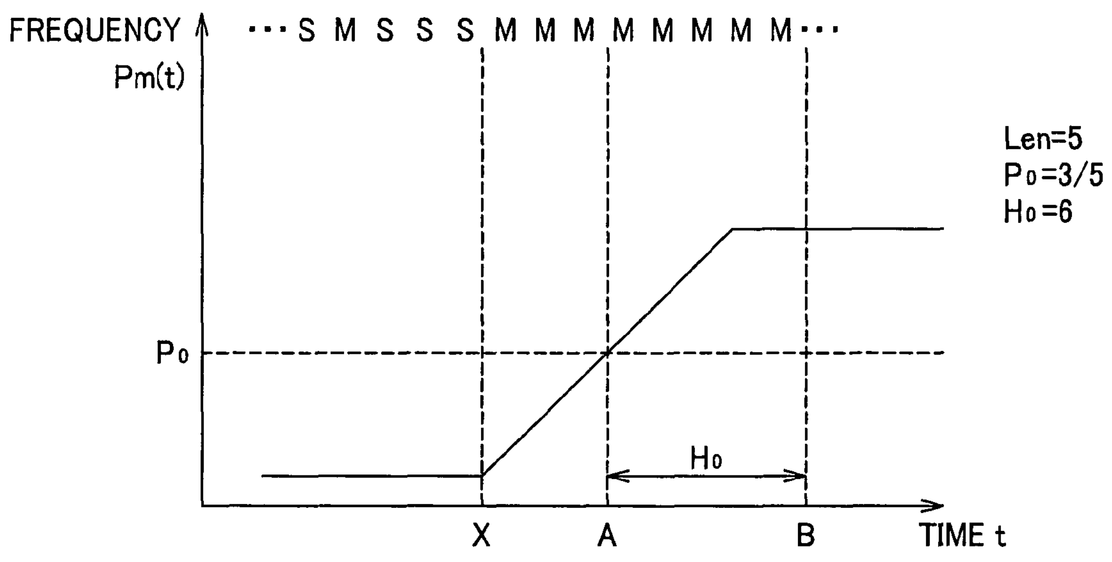
FIG. 5 is a view for explaining the state for detecting start of musical continuous time period.

FIG. 5 is a view for explaining the state for comparing discrimination frequency of music with threshold value to detect start of music continuous time period. At the upper portion of the figure, discrimination kinds at respective times are represented by M (music) and S (speech). The ordinate is discrimination frequency Pm(t) of music at time t. In this example, the discrimination frequency Pm(t) is calculated at time period Len as explained in FIG. 3, and is Len is set to 5 (five) in FIG. 5. In addition, threshold value P0 of discrimination frequency Pm(t) for start judgment is set to 3/5, and threshold value H0 of the number of discriminations is set to 6 (six).

When discrimination frequencies Pm(t) are calculated on a predetermined time basis, discrimination frequency Pm(t) in the time period Len at the point A in the figure becomes equal to 3/5, and first becomes equal to threshold value P0 or more. Thereafter, discrimination frequency Pm(t) is continuously maintained so that it is equal to threshold value P0 or more. Thus, start of music is detected for the first time at the point B in the figure in which the state where the discrimination frequency Pm(t) is threshold value P0 or more is maintained by continuous H0 times (sec.).

As also understood from FIG. 5, the actual start position of music is slightly this side from the point A where the discrimination frequency Pm(t) becomes equal to threshold value P0 or more for the first time. When it is assumed that the discrimination frequency Pm(t) continuously increases until it becomes equal to threshold value P0 or more, the point X in the figure can be estimated as start position. Namely, when threshold value P0 of the discrimination frequency Pm(t) is assumed to be P0=J/Len, the point X returned by J from the point A where the discrimination frequency Pm(t) becomes equal to threshold value P0 or more for the first time is detected as estimated start position. In the example of FIG. 5, since J is equal to 3, the position returned by 3 from the point A is detected as music start position.

Figure 6:
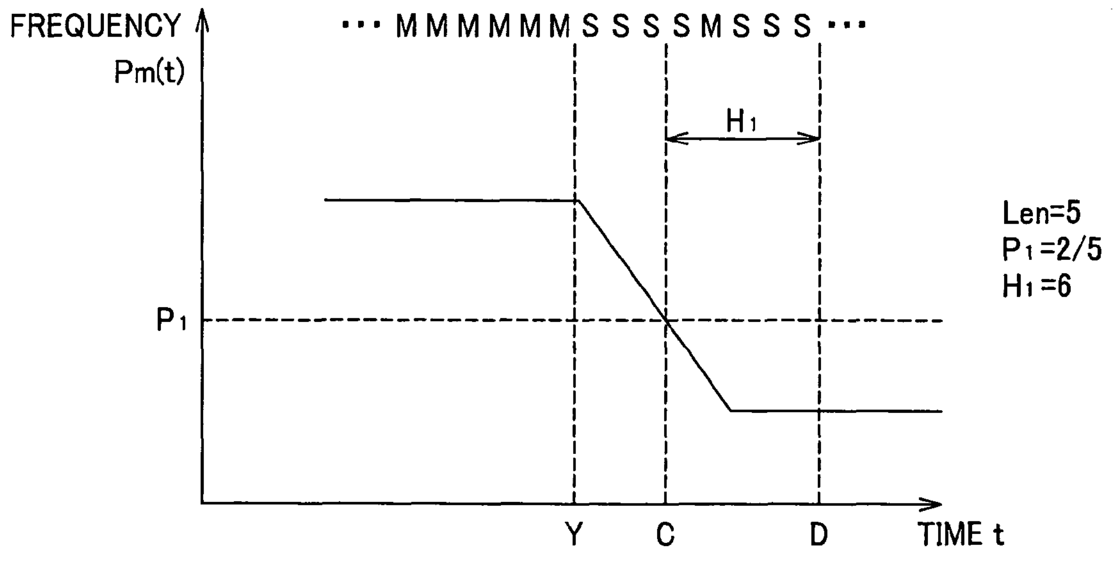
FIG. 6 is a view for explaining the state for detecting end of musical continuous time period.

FIG. 6 is a view for explaining the state for detecting end of music continuous time period as compared to the thrshold value of discrimination frequency of music. Similarly to FIG. 5, M indicates that discrimination is made as music, and S indicates that discrimination is made as speech. Moreover, the ordinate is discrimination frequency Pm(t) of music at time t. In this example, the discrimination frequency is calculated at time period Len as explained in FIG. 3, and Len is set to 5 (five) in FIG. 6. Moreover, threshold value P1 of discrimination frequency Pm(t) for end judgment is set to 2/5, and threshold value H1 of the number of discriminations is set to 6 (six). It is to be noted that threshold value P1 for end detection may be the same as threshold value P0 for start detection.

When discrimination frequency is calculated on a predetermined time basis, discrimination frequency Pm(t) in the time period Len at the point C in the figure becomes equal to ⅖ so that it becomes equal to threshold P1 or less for the first time. Also thereafter, discrimination frequency Pm(t) is continuously maintained so that it is equal to threshold value P1 or less, and end of music is detected for the first time at the point D in the figure in which the state where the discrimination frequency is threshold value P1 or less is maintained by continuous H1 times (sec.).

Also understood from FIG. 6, the actual end position of music is slightly this side from the point C where the discrimination frequency Pm(t) becomes equal to threshold value P1 or less for the first time. When it is assumed that the discrimination frequency Pm(t) continuously decreases until it becomes equal to threshold value P1 or less, the point Y in the figure can be estimated as end position. Namely, when threshold value P1 of the discrimination frequency Pm(t) is assumed to be P1=K/Len, the point Y returned by Len-k from the point C where the discrimination frequency Pm(t) becomes equal to the threshold value P1 or less for the first time is detected as estimated end position. In the example of FIG. 6, since K is equal to 2, the position returned by 3 from the point C is detected as music end position.

Figure 7A:
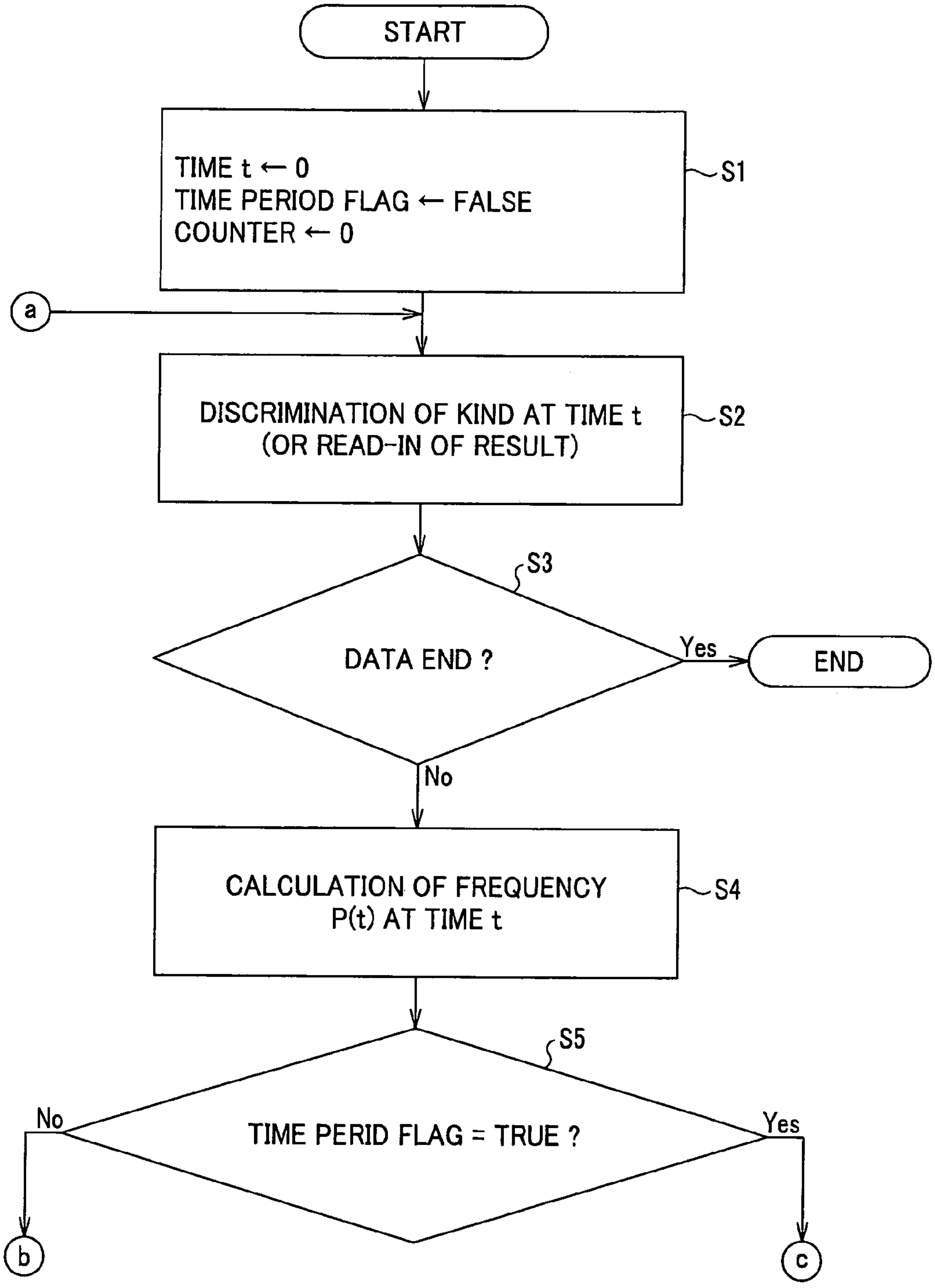
FIGS. 7A to 7C are flowcharts showing continuous time period detection processing in the above-mentioned information detecting apparatus.
Figure 7B:
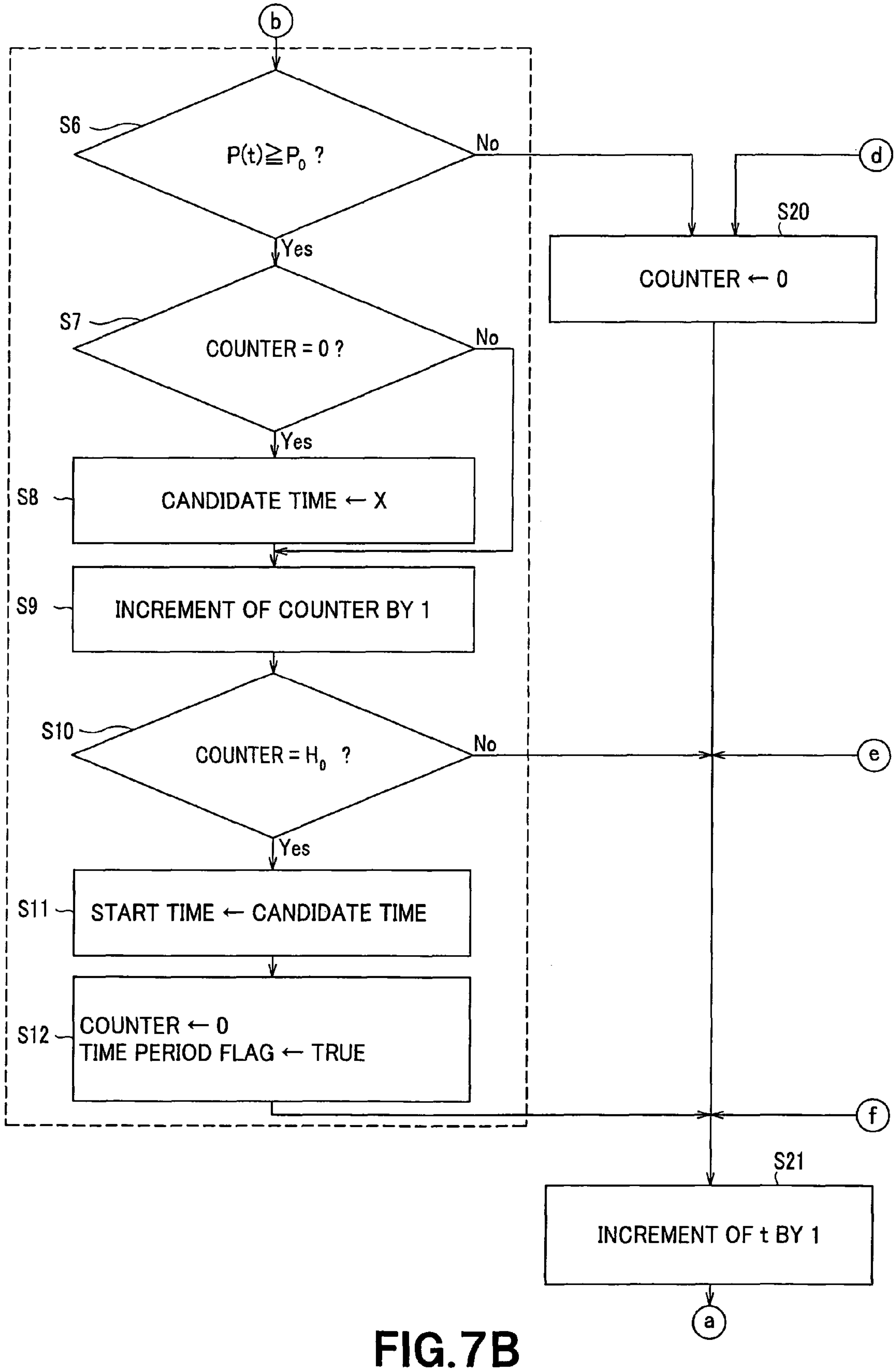
Figure 7C:
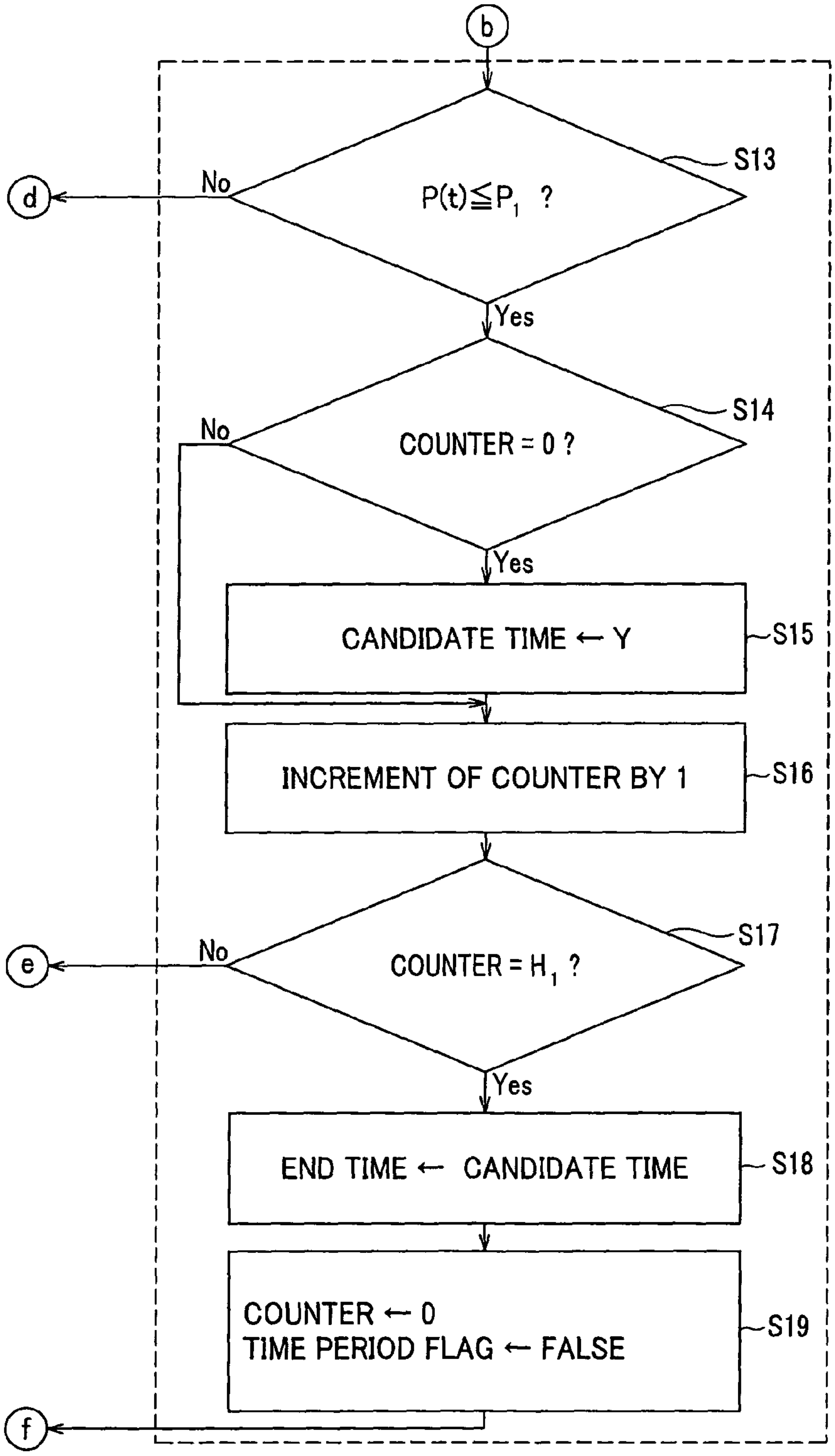

The above-mentioned continuous time period detection processing are shown in the flowcharts of FIGS. 7A to 7C. First, at step S1, initialization processing is performed. In concrete terms, current time t is caused to be zero (0), and time period flag indicating that current time period is continuous time period of a certain kind is caused to be FALSE, i.e., is caused to be the fact that current time period is not continuous time period. Moreover, value of the counter which counts the number of times in which the state where the discrimination frequency P(t) is more than threshold value or is less than threshold value is maintained is set to 0 (zero).

Then, at step S2, kind at time t is discriminated. It is to be noted that in the case where kind has been already discriminated, discrimination information at time t is read.

Subsequently, at step S3, whether or not arrival is made to data end from the result which has been discriminated or read in is discriminated. In the case where arrival is made to the data end (Yes), processing is completed. On the other hand, in the case where arrival is not made to the data end (No), processing proceeds to step S4.

At the step S4, discrimination frequency P(t) at time t of kind in which continuous time period is desired to be detected (e.g., music) is calculated.

At step S5, whether or not time period flag is TRUE, i.e., continuous time period is discriminated. In the case where time period flag is TRUE (Yes), processing proceeds to step S13. In the case where the time period flag is not continuous time period (No), i.e., False, processing proceeds to step S6.

At the subsequent steps S6 to S12, start detection processing of continuous time period is performed. First, at the step S6, whether or not the discrimination frequency P(t) is threshold value P0 for start detection or more is discriminated. Here, in the case where the discrimination frequency P(t) is less than threshold value P0 (No), value of the counter is reset to zero (0) at the step S20. At step S21, time t is incremented by 1 to return to the step S2. On the other hand, in the case where the discrimination frequency P(t) is less than threshold value P0 (Yes), processing proceeds to step S7.

Then, at step S7, whether or not value of the counter is equal to 0 (zero) is discriminated. In the case where value of the counter is 0 (Yes), X is stored as start candidate time at step S8 to proceed to step S9 to increment value of the counter by 1. Here, X is position as explained in FIG. 5, for example. On the other hand, in the case where value of the counter is not 0 (No), processing proceeds to step S9 to increment the value of the counter by 1.

Subsequently, at step S10, whether or not value of the counter reaches threshold value H0 is discriminated. In the case where the value of the counter does not reach threshold value H0 (No), processing proceeds to step S21 to increment time t by 1 to return to the step S2. On the other hand, in the case where the value of the counter reaches the threshold value H0 (Yes), processing proceeds to step S11.

At the step S11, the stored start candidate time X is established as start time. At step S12, value of the counter is reset to 0 (zero), and the time period flag is changed into TRUE to increment time t by 1 at step S21 to return to the step S2.

Until start of continuous time period is detected, i.e., until it is discriminated at the step S5 that the time period flag is TRUE, the above-mentioned processing is repeated.

When start of the continuous time period is detected, end detection processing of the continuous time period is performed at the following steps S13 to S19. First, at step S13, whether or not the discrimination frequency P(t) is threshold value P1 for end detection or less is discriminated. Here, in the case where discrimination frequency P(t) is greater than threshold value P1 (No), value of the counter is reset to 0 (zero) at step S20 to increment time t by 1 at step S21 to return to the step S2. On the other hand, in the case where discrimination frequency P(t) is threshold value P1 or less (Yes), processing proceeds to step S14.

Then, at the step S14, whether or not the value of the counter is equal to 0 (zero) is discriminated. In the case where the value of the counter is equal to 0 (Yes), Y is stored as end candidate time at step S15 to proceed to step S16 to increment value of the counter by 1. Here, Y is position as explained in FIG. 6, for example. On the other hand, in the case where the value of the counter is not equal to 0 (No), processing proceeds to step S16 to increment the value of the counter by 1.

Subsequently, at step S17, whether or not the value of the counter reaches threshold value H1 is discriminated. In the case where the value of the counter does not reach the threshold value H1 (No), processing proceeds to step S21 to increment time t by 1 to return to the step S2. On the other hand, in the case where the value of the counter reaches the threshold value H1 (Yes), processing proceeds to step S18.

At the step S18, stored end candidate time Y is established as end time. At step S19, the value of the counter is reset to 0 and the time period flag is changed into FALSE. At step S21, time t is incremented by 1 to return to the step S2.

Until end of the continuous time period is detected, i.e., until the time period flag is discriminated as FALSE at the step S5, the above-mentioned processing is repeated.

As stated above, in accordance with the information detecting apparatus 1 in this embodiment, audio signal in the information source is discriminated into respective kinds (categories) every predetermined time unit. In the case where, in evaluating discrimination frequency of kind to detect continuous time period of the same kind, discrimination frequency of a certain kind becomes equal to a predetermined threshold value or more for the first time and the state where the discrimination frequency is the threshold value or more is continued by a predetermined time, start of continuous time period of that kind is detected, and in the case where discrimination frequency becomes equal to the predetermined threshold value or less for the first time and the state where the discrimination frequency is threshold value or less is continued by a predetermined time, end of continuous time period of the kind is detected to thereby have ability to precisely detect start position and end position of the continuous time period even in the case where temporary mixing of sound such as noise, etc. is made during continuous time period, or discrimination error exists somewhat.

It is to be noted that while the invention has been described in accordance with preferred embodiments thereof illustrated in the accompanying drawings and described in detail, it should be understood by those ordinarily skilled in the art that the invention is not limited to embodiments, but various modifications, alternative constructions or equivalents can be implemented without departing from the scope and spirit of the present invention as set forth by appended claims.

For example, in the above-described embodiment, the present invention has been explained as the configuration of hardware, but is not limited to such implementation. The present invention may be also realized by allowing CPU (Central Processing Unit) to execute arbitrary processing as computer program. In this case, the computer program may be also embodied as a computer-readable recording medium having a program recorded therein, and may be also provided by performing transmission through Internet or other transmission medium.

INDUSTRIAL APPLICABILITY

In accordance with the above-described present invention, audio signal included in information source is discriminated and classified into kinds (categories) such as music or speech on a predetermined time basis. In evaluating discrimination frequency of that kind to detect continues time period of the same kind, even in the case where temporary mixing of sound such as noise is made during continuous time period, or discrimination error exists somewhat, it is possible to precisely detect start position and end position of the continuous time period.

The invention claimed is:

1. An apparatus for detecting speech and music within an audio signal, said apparatus comprising:

an analyzer configured to perform a classification of a section of the audio signal, said section comprising a plurality of unclassified subsections, each unclassified subsection of the plurality of unclassified subsections having a predefined subsection duration within a range of one to several seconds, by (a) classifying each unclassified subsection of the plurality of unclassified subsections as at least one of a speech subsection and a music subsection to provide a plurality of classified subsections, and (b) determining a corresponding likelihood value for speech and music for each classified subsection of the plurality of classified subsections, said likelihood value for speech indicating the likelihood of a subsection to be a speech subsection, and said likelihood value for music indicating the likelihood of a subsection to be a music subsection;

a recorder configured to, for each classified subsection of the plurality of classified subsections, store said corresponding likelihood value;

a classification frequency calculator configured to (a) read each said corresponding likelihood value from the recorder, and (b) calculate at least a classification frequency for speech subsections and a classification frequency for music subsections based on an average likelihood value determined from each said corresponding likelihood value within a predetermined first time duration longer than the predefined subsection duration; and a detector configured to detect a continuous time period of a single type of audio signal based on the classification frequencies, by (a) registering a start of the continuous time period when, for at least a second time duration, the calculated classification frequency is not less than a first threshold value, and (b) registering an end of the continuous time period when, for at least a third time duration, the calculated classification frequency is not greater than a second threshold value, wherein:

the classification frequency for speech subsections is calculated by equation 1:

$$P_s(t) = \frac{\sum_{k=0}^{Len-1} p(t-k)\cdot S(t-k)}{Len} \tag{1}$$

where t is time, k is an integer, S(t) =1 if a subsection at time t is a speech subsection, S(t) =0 if a subsection at time t is not a speech subsection, Len is the predetermined first time duration, and p is the likelihood value, and the classification frequency for music subsections is calculated by equation 2:

$$P_m(t) = \frac{\sum_{k=0}^{Len-1} p(t-k)\cdot M(t-k)}{Len} \tag{2}$$

where M(t)=1 if a subsection at time t is a music subsection, and M(t) =0 if a subsection at time t is not a music subsection.

2. A method for detecting speech and music within an audio signal, said method comprising the steps of:

performing, with an audio analyzer, a classification of a section of the audio signal, said section comprising a plurality of unclassified subsections, each unclassified subsection of the plurality of unclassified subsections having a predefined subsection duration within a range of one to several seconds, by (a) classifying each unclassified subsection of the plurality of unclassified subsections as at least one of a speech subsection and a music subsection to provide a plurality of classified subsections, and (b) determining a corresponding likelihood value for speech and music for each classified subsection of the plurality of classified subsections, said likelihood value for speech indicating the likelihood of a subsection to be a speech subsection, and said likelihood value for music indicating the likelihood of a subsection to be a music subsection;

storing, in a recorder, for each classified subsection of the plurality of classified subsections, said corresponding likelihood;

calculating, with a classification frequency calculator, at least one classification frequency, by (a) reading each said corresponding likelihood from the recorder, and (b) calculating at least a classification frequency for speech subsections and a classification frequency for music subsections based on an average likelihood value determined from each said corresponding likelihood value within a predetermined first time duration longer than the predefined subsection duration; and detecting a continuous time period of a single type of audio signal based on the classification frequencies, by (a) registering with a detector a start of the continuous time period when, for at least a second time duration, the calculated classification frequency is not less than a first threshold value, and (b) registering with the detector an end of the continuous time period when, for at least a third time duration, the calculated classification frequency is not greater than a second threshold value, wherein:

the classification frequency for speech subsections is calculated by equation 1:

$$P_s(t) = \frac{\sum_{k=0}^{Len-1} p(t-k) \cdot S(t-k)}{Len} \tag{1}$$

where t is time, k is an integer, S(t) =1 if a subsection at time t is a speech subsection, S(t) =0 if a subsection at time t is not a speech subsection, Len is the predetermined first time duration, and p is the likelihood value, and the classification frequency for music subsections is calculated by equation 2:

$$P_m(t) = \frac{\sum_{k=0}^{Len-1} p(t-k) \cdot M(t-k)}{Len} \tag{2}$$

where M(t) =1 if a subsection at time t is a music subsection, and M(t) =0 if a subsection at time t is not a music subsection.

3. A non-transitory computer-readable recording medium storing a program recorded therein, the program comprising the steps of:

performing a classification of a section of the audio signal, said section comprising a plurality of unclassified subsections, each unclassified subsection of the plurality of unclassified subsections having a predefined subsection duration within a range of one to several seconds, by (a) classifying each unclassified subsection of the plurality of unclassified subsections as at least one of a speech subsection and a music subsection to provide a plurality of classified subsections, and (b) determining a corresponding likelihood value for speech and music for each classified subsection of the plurality of classified subsections, said likelihood value for speech indicating the likelihood of a subsection to be a speech subsection, and said likelihood value for music indicating the likelihood of a subsection to be a music subsection;

storing, for each classified subsection of the plurality of classified subsections, said corresponding likelihood;

calculating at least one classification frequency, by (a) reading each said corresponding likelihood from the recorder, and (b) calculating at least a classification frequency for speech subsections and a classification frequency for music subsections based on an average likelihood value determined from each said corresponding likelihood value within a predetermined first time duration longer than the predefined subsection duration; and detecting a continuous time period of a single type of audio signal based on the classification frequencies, by (a) registering a start of the continuous time period when, for at least a second time duration, the calculated classification frequency is not less than a first threshold value, and (b) registering an end of the continuous time period when, for at least a third time duration, the calculated classification frequency is not greater than a second threshold value, wherein:

the classification frequency for speech subsections is calculated by equation 1:

$$P_s(t) = \frac{\sum_{k=0}^{Len-1} p(t-k) \cdot S(t-k)}{Len} \tag{1}$$

where t is time, k is an integer, S(t) =1 if a subsection at time t is a speech subsection, S(t) =0 if a subsection at time t is not a speech subsection, Len is the predetermined first time duration, and p is the likelihood value, ands the classification frequency for music subsections is calculated by equation 2:

$$P_m(t) = \frac{\sum_{k=0}^{Len-1} p(t-k) \cdot M(t-k)}{Len} \tag{2}$$

where M(t) =1 if a subsection at time t is a music subsection, and M(t) =0 if a subsection at time t is not a music subsection.

* * * * *